(12) United States Patent
Sugimoto et al.

(10) Patent No.: US 8,008,749 B2
(45) Date of Patent: Aug. 30, 2011

(54) SEMICONDUCTOR DEVICE HAVING VERTICAL ELECTRODES STRUCTURE

(75) Inventors: Masahiro Sugimoto, Toyota (JP); Tsutomu Uesugi, Seto (JP); Hiroyuki Ueda, Kasugai (JP); Narumasa Soejima, Nisshin (JP); Tetsu Kachi, Nisshin (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 64 days.

(21) Appl. No.: 11/667,735

(22) PCT Filed: Nov. 14, 2005

(86) PCT No.: PCT/JP2005/021195
§ 371 (c)(1),
(2), (4) Date: May 15, 2007

(87) PCT Pub. No.: WO2006/052025
PCT Pub. Date: May 18, 2006

(65) Prior Publication Data
US 2008/0128862 A1    Jun. 5, 2008

(30) Foreign Application Priority Data
Nov. 15, 2004    (JP) .................. 2004-330123

(51) Int. Cl.
*H01L 29/20*    (2006.01)
(52) U.S. Cl. .................. 257/615; 257/E29.1; 438/19
(58) Field of Classification Search .................. 257/615, 257/E29.1; 438/19
See application file for complete search history.

(56) References Cited

U.S. PATENT DOCUMENTS

| 5,877,047 | A | * | 3/1999 | Weitzel et al. ................ 438/173 |
| 6,075,259 | A | * | 6/2000 | Baliga ............................ 257/77 |
| 6,188,555 | B1 | | 2/2001 | Mitlehner et al. |
| 6,232,625 | B1 | | 5/2001 | Bartsch et al. |

(Continued)

FOREIGN PATENT DOCUMENTS
EP    1 313 147    5/2003
(Continued)

OTHER PUBLICATIONS
European Patent Office Communication for EP Appl. No. 05 828 962.0 dated Feb. 22, 2011.
(Continued)

*Primary Examiner* — Thao X Le
*Assistant Examiner* — Matthew Gordon
(74) *Attorney, Agent, or Firm* — Finnegan, Henderson, Farabow, Garrett & Dunner, LLP

(57) ABSTRACT

A semiconductor device is provided with a drain electrode 22, a semiconductor base plate 32, an electric current regulation layer 42 covering a part of a surface of the semiconductor base plate 32 and leaving a non-covered surface 55 at the surface of the semiconductor base plate 32, a semiconductor layer 50 covering a surface of the electric current regulation layer 42, and a source electrode 62 formed at a surface of the semiconductor layer 50. A drift region 56, a channel forming region 54, and a source region 52 are formed within the semiconductor layer 50. The drain electrode 22 is connected to a first terminal of a power source, and the source electrode 62 is connected to a second terminal of the power source. With this semiconductor layer 50, it is possible to increase withstand voltage or reduce the occurrence of current leakage.

23 Claims, 7 Drawing Sheets

U.S. PATENT DOCUMENTS

| | | |
|---|---|---|
| 2001/0040246 A1 | 11/2001 | Ishii |
| 2003/0047768 A1* | 3/2003 | Disney .................. 257/302 |
| 2003/0089947 A1 | 5/2003 | Kawaguchi et al. |
| 2003/0201482 A1* | 10/2003 | Shimoida et al. ............ 257/302 |
| 2004/0164350 A1 | 8/2004 | Kawaguchi et al. |

FOREIGN PATENT DOCUMENTS

| | | |
|---|---|---|
| JP | 2000-252475 | 9/2000 |
| JP | 2001-230410 | 8/2001 |
| JP | 2001-522528 | 11/2001 |
| JP | 2003-152180 | 5/2003 |
| WO | WO 98/49762 | 11/1998 |

OTHER PUBLICATIONS

Notification of Reasons for Rejection for JP Appl. No. 2004-330123 dated May 31, 2011.

* cited by examiner

SEMICONDUCTOR DEVICE HAVING VERTICAL ELECTRODES STRUCTURE

TECHNICAL FIELD

This application claims priority to Japanese Patent Application No. 2004-330123 filed on Nov. 15, 2004, the contents of which are hereby incorporated by reference.

The present invention relates to a semiconductor device wherein one of main electrodes is formed on a top surface of the semiconductor device and the other of main electrodes is formed on a bottom surface of the semiconductor device. The pair of main electrodes may be, for example, a drain electrode and a source electrode, a corrector electrode and an emitter electrode, or an anode electrode and a cathode electrode. In the present specification, the pair of main electrodes, one of which is formed on the top surface and the other of which is formed on the bottom surface, will be termed a vertical electrodes structure.

BACKGROUND ART

Crystal defects are invariably present in a semiconductor layer. The semiconductor layer of III-V semiconductor manufactured by existing manufacturing techniques, for example, has many crystal defects. Most of the crystal defects extend in the direction of thickness of the semiconductor layer.

When semiconductor devices are made from III-V semiconductors such as GaN (gallium nitride) or the like, there is a greater dielectric breakdown field and a higher degree of movement of saturated electrons than in a case where silicon is used. As a result, when semiconductor devices are manufactured from III-V semiconductor layers, semiconductor devices should be realized that have high withstand voltage and are capable of controlling large currents. Furthermore, research is being actively performed on semiconductor devices that have a vertical electrodes structure. Semiconductor devices with the vertical electrodes structure have the advantage that insulation can easily be maintained between the pair of main electrodes. Further, with semiconductor devices that have the vertical electrodes structure, a wiring layout connected to the pair of main electrodes can be simplified. As a result, semiconductor devices with the vertical electrodes structure have the advantage that it is easy to reduce a distance of wiring formed on a base plate on which the semiconductor device is mounted. When the distance of the wiring is reduced, resistance of the wiring can be reduced.

As described above, existing III-V semiconductor layers contain many crystal defects. Under current conditions, where crystal defects are present, the issue as to how semiconductor devices with excellent characteristics can be manufactured is consequently an important one. Reducing the effects on characteristics of semiconductor device caused by crystal defects is extremely important when III-V semiconductor layers are used. However, this object is not limited to the case where III-V semiconductor layers are used. Reducing the effects on characteristics of semiconductor device caused by crystal defects is widely needed in various semiconductor materials.

In the technique taught in Japanese Laid-Open Patent Application Publication No. 2001-230410, a semiconductor device is manufactured by using so-called epitaxial lateral overgrowth method. In the technique taught in Japanese Laid-Open Patent Application Publication No. 2001-230410, the epitaxial lateral overgrowth method is executed after a mask that has openings has been formed on a base plate. When the epitaxial lateral overgrowth method is adopted, crystals grow from the base plate exposed at the openings of the mask in a direction perpendicular to a surface of the base plate. In a region covered by the mask, the crystals grow in a direction parallel to the surface of the base plate. This method allows crystal defects to be reduced in the region where the crystals have grown in the direction parallel to the surface of the base plate. However, many crystal defects are formed in the region where the crystals have grown in the direction perpendicular to the surface of the base plate. Moreover, it is not possible to grow crystals in the direction parallel to the surface of the base plate without also having the region where the crystals grow in the direction perpendicular to the surface of the base plate. As a result, it is not possible to use the epitaxial lateral overgrowth method to form only regions which have a low concentration of crystal defects. Therefore, in the technique of Japanese Laid-Open Patent Application Publication No. 2001-230410, a semiconductor layer having regions with a high concentration of crystal defects and regions with a low concentration of crystal defects is formed. The regions with the high concentration of crystal defects and the regions with the low concentration of crystal defects are distributed in the semiconductor layer. In the technique of Japanese Laid Open Patent Application Publication No. 2001-230410, a source region, a channel forming region and a drift region are formed within the region with the low concentration of crystal defects. The source region, the channel forming region and the drift region are stacked in the direction of thickness of the semiconductor layer. Furthermore, a trench is formed in the region with the high concentration of crystal defects, and a gate electrode is located within the trench. Moreover, a source electrode is formed at a top surface of the semiconductor device, and a drain electrode is formed at a bottom surface of the semiconductor device. This allows a semiconductor device with a vertical electrodes structure to be obtained in which the source electrode and the drain electrode are located separately at the top surface and the bottom surface respectively of the semiconductor device.

With the technique of Japanese Laid-Open Patent Application Publication No. 2001-230410, the source region, the channel forming region and the drift region are stacked in a vertical direction to form a vertical semiconductor structure in the region with the low concentration of crystal defects. Since the semiconductor structure can be formed in the region having the low concentration of crystal defects, the withstand voltage of the semiconductor device can be increased.

However, crystal defects are also present in the region with the low concentration of crystal defects that has been manufactured by the epitaxial lateral overgrowth method. Most of these crystal defects extend in the direction of thickness of the semiconductor layer. That is, with the semiconductor device of Japanese Laid-Open Patent Application Publication No. 2001-230410, the direction in which the source region, the channel forming region and the drift region are stacked is parallel to the direction in which the crystal defects extend. As a result, the direction of the electric field of the vertical semiconductor structure is parallel to the direction in which the crystal defects extend. When these two are parallel, the crystal defects can readily affect the characteristics of this vertical semiconductor structure.

Alternatively, the formation of a horizontal semiconductor structure could also be considered, in which the source region, the channel forming region and the drift region are distributed in a horizontal direction along the plane of the semiconductor layer. In this case, the direction of an electric field of the horizontal semiconductor structure is orthogonal to the direction in which the crystal defects extend. When these two are orthogonal, the crystal defects cannot readily affect the characteristics of the horizontal semiconductor structure. However, when the horizontal semiconductor structure is used, a semiconductor device is obtained in which both main electrodes are present on the top surface of the semiconductor device (in the present specification, this electrodes structure will be termed a horizontal electrodes structure).

Although a vertical electrodes structure can be found in the semiconductor device of Japanese Laid-Open Patent Application Publication No. 2001-230410, the direction of the electric field of the vertical semiconductor structure is parallel to the direction in which the crystal defects extend. As a result, the characteristics of the vertical semiconductor structure can readily be affected by the crystal defects. For example, in the drift region that has the purpose of increasing withstand voltage, the electric field that is formed when the semiconductor device has been turned off is parallel to the direction in which the crystal defects extend, and consequently the presence of the crystal defects reduces the withstand voltage of the semiconductor structure. Furthermore, crystal defects are also present in the channel forming region, these crystal defects extending from the source region towards the drift region. As a result, current leakage via the crystal defects occurs in the channel forming region that has the purpose of controlling the on/off of electric current.

If the horizontal semiconductor structure is adopted, the direction of the electric field of the horizontal semiconductor structure is orthogonal to the direction in which the crystal defects extend. As a result, it is possible to obtain a structure in which the presence of crystal defects cannot readily affect the characteristics of the horizontal semiconductor structure (for example, withstand voltage characteristics or current leakage characteristics). However, when the horizontal semiconductor structure is adopted, the semiconductor device has the horizontal electrodes structure, and the vertical electrodes structure cannot be realized.

The present invention aims to adopt a horizontal semiconductor structure, wherein the presence of crystal defects does not readily affect characteristics of the semiconductor structure, while realizing a semiconductor device with a vertical electrodes structure, in which it is simple to maintain insulation between the pair of main electrodes and in which it is easy to simplify the wiring layout connected to the pair of main electrodes.

DISCLOSURE OF THE INVENTION

A semiconductor device according to the inventions comprises a first conductor layer. The first conductor layer is connected to a first terminal of a power source when the semiconductor device is in use. The first terminal has a first polarity. The semiconductor device further comprises an electric current regulation layer. The electric current regulation layer covers a part of a surface of the first conductor layer and leaves a non-covered surface at the surface of the first conductor layer. The semiconductor device further comprises a semiconductor layer that covers at least a surface of the electric current regulation layer. The semiconductor device further comprises a conducting region connecting the semiconductor layer to the first conductor layer at the non-covered surface. The semiconductor device further comprises a second conductor layer that is formed at a surface of the semiconductor layer. The second conductor layer is located at a position separated from the non-covered surface when viewed from a direction perpendicular to a plan in which the semiconductor layer extends. The second conductor layer is connected to a second terminal of the power source when the semiconductor device is in use. The second terminal has a second polarity.

In the semiconductor device according to the invention, a semiconductor structure is formed in the semiconductor layer. The semiconductor structure performs a specific operation when a portion of the semiconductor layer close to the non-covered surface is connected to the first polarity of the power source through the conducting region and the first conductor layer, and a portion of the semiconductor layer close to the second conductor layer is connected to the second polarity of the power source through the second conductor layer.

The first conductor layer, the second conductor layer, and the conducting region may all be formed from a plurality of layers. The first conductor layer, the second conductor layer, and the conducting region may all be formed from low-resistance conducting material that has a high concentration of impurities, from conductive metal, or from a combination thereof. The semiconductor layer is not restricted to being a single layer, but may also be formed by stacking a plurality of layers.

In the semiconductor device, the first conductor layer and the second conductor layer to be connected to the power source are formed at a top surface and a bottom surface respectively of the semiconductor device. The semiconductor device of the present invention comprises a vertical electrodes structure.

Further, in the semiconductor device of the present invention, a portion of the semiconductor layer close to the non-covered surface is connected to the first conductor layer via the conducting region and the non-covered surface. The first conductor layer is connected to the first polarity of the power source. A portion of the semiconductor layer close to the second conductor layer (a portion of the semiconductor layer far from the non-covered surface) is connected to the second polarity of the power source via the second conductor layer. Furthermore, the electric current regulation layer is formed at the bottom surface of the semiconductor layer in at least the area where the semiconductor structure is formed. Consequently, electric current is prevented from flowing through the semiconductor structure in the direction of thickness of the semiconductor layer. That is, the electric current flows through the semiconductor structure in a horizontal direction along the semiconductor layer. The semiconductor structure formed in the semiconductor layer operates as a horizontal semiconductor structure.

When the horizontal semiconductor structure is turned off, a voltage difference is formed along a direction parallel to a surface of the electric current regulation layer. That is, an electric field operates in the direction parallel to the surface of the electric current regulation layer. The majority of crystal defects present in the semiconductor layer extend in a direction approximately perpendicular to the surface of the electric current regulation layer. Consequently, an approximately orthogonal relationship is obtained between the direction of the electric field within the semiconductor layer and the direction in which the crystal defects extend within the semiconductor layer.

With the semiconductor device of the present invention, a horizontal semiconductor structure can be formed within the semiconductor layer using the electric current regulation layer and the semiconductor layer covering the surface of the electric current regulation layer. Further, a vertical electrodes structure can be realized by disposing the first conductor layer and the second conductor layer at the top and bottom surface respectively of the semiconductor device, and by causing conductivity using the conducting region and the non-covered surface that are located between the first conductor layer and the second conductor layer. A vertical electrodes structure can be realized even while a horizontal semiconductor structure is adopted wherein the presence of crystal defects does not readily affect characteristics of the semiconductor structure. It is possible to obtain a semiconductor device having a vertical electrodes structure, in which it is simple to maintain insulation between the pair of main electrodes and in which it is easy to simplify the wiring layout connecting the pair of main electrodes, while simultaneously adopting the horizontal semiconductor structure.

The semiconductor structure formed in the semiconductor layer may comprise a first semiconductor region, a second semiconductor region and an intermediate semiconductor region. The first semiconductor region is located at a position close to the non-covered surface and has a higher impurity concentration of a first conductivity type. The second semiconductor region is located at a position close to the second conductor layer, and has a higher impurity concentration of the first conductivity type. The intermediate semiconductor region is interposed between the first semiconductor region and the second semiconductor region and has a lower impurity concentration of the first conductivity type. In this case, the semiconductor device further comprises a control electrode facing the intermediate semiconductor region.

The aforementioned structure can provide a semiconductor structure functioning as an accumulation MOSFET (also termed ACCUFET: Accumulation FET) or a semiconductor structure with Schottky-gate. Since the intermediate semiconductor region has a lower impurity concentration, carriers that move along the intermediate semiconductor region have a greater degree of movement. A semiconductor device capable of rapid operation can thus be obtained.

In the aforementioned semiconductor device, a portion of the first semiconductor region of the semiconductor layer that is close to the non-covered surface functions as a drift region. In this drift region, an approximately orthogonal relationship is obtained between the direction in which the crystal defects extend and the direction of an electric field obtained when the semiconductor device has been turned off. As a result, the effects caused by the crystal defects are reduced within the drift region, and characteristics of high withstand voltage can be realized.

Further, the intermediate semiconductor region of the semiconductor device functions as a channel forming region that controls the movement of the carriers and switches the semiconductor device between on and off. In this channel forming region, also, an approximately orthogonal relationship is obtained between the direction in which the crystal defects extend and the direction in which electric current flows. It is consequently possible to reduce current leakage caused by the crystal defects in the aforementioned semiconductor device.

The semiconductor structure formed in the semiconductor layer may comprise a first semiconductor region, a second semiconductor region and an intermediate semiconductor region. The first semiconductor region is located at a position close to the non-covered surface and has impurities of a first conductivity type. The second semiconductor region is located at a position close to the second conductor layer and has impurities of the first conductivity type. The intermediate semiconductor region is interposed between the first semiconductor region and the second semiconductor region and has impurities of a second conductivity type. In this case, the semiconductor device further comprises a control electrode facing the intermediate semiconductor region.

The aforementioned structure can provide a semiconductor structure that functions an MOS (Metal Oxide Semiconductor).

In the aforementioned semiconductor device, a pn junction is formed between the intermediate semiconductor region and a portion of the first semiconductor region of the semiconductor layer that is close to the non-covered surface. As a result, a depleted layer is formed from a boundary face of the pn junction when the semiconductor structure has been turned off. The depleted layer extends across a wide area of the first semiconductor region. Consequently, an approximately orthogonal relationship is obtained between the direction in which the crystal defects extend and the direction of an electric field within the depleted layer. As a result, a depleted layer is obtained in which the effects caused by the crystal defects are reduced, and high withstand voltage can be realized.

The intermediate semiconductor region of the semiconductor device functions as a channel forming region that controls the movement of carriers and switches the semiconductor structure between on and off. In this channel forming region, also, an approximately orthogonal relationship is obtained between the direction in which the crystal defects extend and the direction in which electric current flows. It is consequently possible to reduce current leakage caused by the crystal defects.

In the semiconductor device described above, the control electrode may face the intermediate semiconductor region via an insulating layer.

Since the insulating layer is being used, it is possible to apply a large gate voltage to the control electrode. A layer in which abundant carriers are present can be formed by applying a large gate voltage to the control electrode at a place facing the control electrode in the intermediate semiconductor region (referred to as a reversed layer, an accumulated layer, etc.), and the carriers can move along this layer. It is possible to reliably control on/off of the semiconductor device. In this case, it is preferred that the intermediate semiconductor region entirely separates the first semiconductor region and the second semiconductor region.

In the semiconductor device described above, the control electrode may be in contact with the intermediate semiconductor region.

Physical contact between the intermediate semiconductor region and the control electrode can be adopted, and the width of the depleted layer can be adjusted by applying voltage to the control electrode. The amount of carriers passing through the intermediate semiconductor region can be controlled by adjusting the width of the depleted layer. It is thus possible to reliably control on/off of the semiconductor device and to control the amount of electric current.

The semiconductor structure formed in the semiconductor layer may comprise a first semiconductor region, a second semiconductor region and a plurality of intermediate semiconductor regions. The first semiconductor region is located at a position close to the non-covered surface and has impurities of a first conductivity type. The second semiconductor region is located at a position close to the second conductor layer and has impurities of the first conductivity type. The plurality of intermediate semiconductor regions is distributed in an area between the non-covered surface and the second conductor layer. The intermediate semiconductor regions have impurities of a second conductivity type. In this case, the semiconductor device further comprises a control electrode connected to the intermediate semiconductor regions.

This structure can provide a semiconductor structure that works as a JFET (Junction Field Effect Transistor).

In the aforementioned semiconductor device, it is possible to use the control electrode to apply voltage to the intermediate semiconductor regions so as to adjust the width of a depleted layer formed in spaces between the intermediate semiconductor regions that are formed in a distributed manner. It is thus possible to control the amount of carriers passing through these spaces. It is possible to control on/off of the semiconductor device and to control the amount of electric current.

The semiconductor structure formed in the semiconductor layer may comprise a first semiconductor region and a second semiconductor region. The first semiconductor region is located at a position close to the non-covered surface. The first semiconductor region has impurities of a first conductivity type. The second semiconductor region is located at a position close to the second conductor layer. The second semiconductor region has impurities of a second conductivity type and is in contact with the first semiconductor region.

This structure can provide a semiconductor structure that works as a diode. A pn junction is formed between the first conductivity type semiconductor region and the second conductivity type semiconductor region.

In the aforementioned semiconductor device, the semiconductor device assumes an on state when voltage in a forward direction is applied to the first semiconductor region and the second semiconductor region. Further, the semiconductor device assumes an off state when voltage in an inverse direction is applied to the first semiconductor region and the second semiconductor region. When off, a depleted layer is formed from a boundary face of the pn junction. The depleted layer extends across a wide area of the first semiconductor region. It is possible to maintain most of the electric field based on the voltage difference of the power source within the depleted layer. The first semiconductor region of the semiconductor device extends in a planar manner on the surface of the electric current regulation layer. As a result, the direction of the electric field formed within the first semiconductor region is approximately parallel to the surface of the electric current regulation layer. Consequently, an approximately orthogonal relationship can be obtained between the direction of the electric field and the direction in which the crystal defects extend. Since there is an approximately orthogonal relationship between the direction of the electric field and the direction of the crystal defects, the first semiconductor region is not readily affected by the crystal defects, and consequently a high electric field can be maintained in this region. A reduction in withstand voltage caused by the crystal defects can thus be avoided in the semiconductor device.

The semiconductor layer may comprise a lower semiconductor layer covering the surface of the electric current regulation layer, and an upper semiconductor layer covering a surface of the lower semiconductor layer. The upper semiconductor layer has a wider band gap than the lower semiconductor layer. In this case, the semiconductor device further comprises a control electrode facing the upper semiconductor layer at a position between the non-covered surface and the second conductor layer. The control electrode may be in contact with the upper semiconductor layer or may face the upper semiconductor layer via an insulating layer.

This structure can provide a semiconductor structure that works an HEMT (High Electron Mobility Transistor).

When this semiconductor structure is turned on, carriers are generated within a potential well formed by the difference in band gap between the lower semiconductor layer and the upper semiconductor layer. The carriers generated in the potential well at the second conductor layer side move within the potential well towards the non-covered surface. The carriers that arrive above the non-covered surface can pass across the conducting region and the non-covered surface, and flow to the first semiconductor layer.

By contrast, when off voltage is applied to the semiconductor structure, a state is created in which carriers cannot be present in the potential well located below the control electrode, and the movement of the carriers is halted.

In the aforementioned semiconductor device, an approximately orthogonal relationship can be obtained between the direction in which the crystal defects extend and the direction of the electric field that operates when the semiconductor structure has been turned off. As a result, the semiconductor layer is not readily affected by the crystal defects, and electric current leakage, etc. in the semiconductor layer is depressed. With the semiconductor device of the present invention, it is possible to accurately control on/off and to accurately control the amount of electric current.

The electric current regulation layer may be made of an insulating material. Specifically, the electric current regulation layer may mainly be made of silicon oxide. Further the electric current regulation layer may be made of a semiconductor material having substantially no impurities. Alternatively, the electric current regulation layer may be made of a semiconductor material having impurities. In this case, the conductivity type of the impurities is different from impurities contained in the lower semiconductor layer.

If the electric current regulation layer is made of an insulating material, it is possible to interrupt the flow of electric current. The electric current flowing through the semiconductor layer flows parallel to the surface of the electric current regulation layer. If silicon oxide is used for the insulating material, the silicon oxide has a large dielectric breakdown electric field, and consequently it is possible to realize a semiconductor device with a high withstand voltage. The electric current regulation layer can also be formed using semiconductor material.

The semiconductor layer may comprise a III-V semiconductor. In this case, it is preferred that the first conductor layer comprises a III-V semiconductor region exposed at the non-covered surface.

The semiconductor device of the present invention is particularly effective when a semiconductor layer of a III-V semiconductor is used, wherein existing manufacturing techniques cannot prevent the presence of crystal defects. If the first conductor layer comprises a III-V semiconductor exposed at the non-covered surface, the first conductor layer can be utilized as a base plate for crystal growth. The III-V semiconductor layer can be grown, using the epitaxial lateral overgrowth method, from the III-V semiconductor layer exposed at the non-covered surface, and can cover the surface of the electric current regulation layer. By using the epitaxial lateral overgrowth method, it is possible to realize a III-V semiconductor layer that extends along the surface of the electric current regulation layer and has a low density of crystal defects. It is consequently possible to maintain a high electric field in the semiconductor layer, and a semiconductor device with a high withstand voltage can be realized. Alternatively, the occurrence of current leakage in the semiconductor layer can be reduced more effectively.

The conducting region may be made of the same material as the semiconductor layer. Alternatively, the conducting region may be mainly made of a low-resistance conducting material. A metal such as aluminum, etc., or polysilicon, etc. containing a high impurity concentration are suitable for use as the low-resistance conducting material.

The conducting region is a region in which the depleted layer is barely formed when the semiconductor device has been turned off. This region barely has a function of maintaining the electric field. Consequently, the withstand voltage of the semiconductor device hardly decreases even though this region is formed from low-resistance conducting material. Moreover, since the region is formed from low-resistance conducting material, carriers can move easily within this region when the semiconductor device has been turned on. When low-resistance conducting material is used for the conducting region, a semiconductor device with reduced on resistance can be obtained. The conducting region may also be formed from the same material as the conductive semiconductor layer.

The present inventers have also created a method for manufacturing the semiconductor device.

A method of manufacturing a semiconductor device according to the invention comprises a step of forming an electric current regulation layer on a part of a surface of a first conductor layer leaving a non-covered surface, a step of growing a semiconductor layer comprising a III-V semiconductor covering the electric current regulation layer from the surface of the first conductor layer exposed at the non-covered surface, and a step of forming a semiconductor structure in the semiconductor layer on the electric current regulation layer.

By performing the aforementioned steps, it is possible to obtain a semiconductor device wherein reduction in withstand voltage caused by the crystal defects can be avoided, or to obtain a semiconductor device wherein current leakage caused by the crystal defects can be depressed.

The method of manufacturing the semiconductor device may further comprise a step of implanting impurities of a conductivity type different from impurities contained in the semiconductor layer, these impurities being implanted at a region of the semiconductor layer covering the surface of the electric current regulation layer, this region being between a side close to and a side far from the non-covered surface. An activated impurity concentration is lowered at the implanted region.

By performing the aforementioned manufacturing step, it is possible to manufacture a semiconductor structure that functions as an accumulation MOSFET.

The step of implanting impurities may be continued until an activated impurity concentration is reversed.

By performing the aforementioned manufacturing step, it is possible to manufacture a semiconductor structure that functions as a MOS or a JFET.

The method of manufacturing the semiconductor device may further comprise a step of implanting impurities of a conductivity type different from impurities contained in the semiconductor layer, these impurities being implanted at a region of the semiconductor layer covering the surface of the electric current regulation layer, this region being separated from the non-covered surface. The step of implanting impurities may be continued until an activated impurity concentration in the implanted region is reversed.

By performing the aforementioned manufacturing step, it is possible to manufacture a semiconductor structure that functions as a diode.

The step of growing the semiconductor layer may comprise a step of growing a lower semiconductor layer covering a surface of the electric current regulation layer, and a step of growing an upper semiconductor layer covering a surface of the lower semiconductor layer. The lower semiconductor layer comprises a III-V semiconductor, and the upper semiconductor layer comprises a III-V semiconductor having a wider band gap than the lower semiconductor layer.

By performing the aforementioned manufacturing step, it is possible to manufacture a semiconductor structure that functions as an HEMT.

The method of manufacturing the semiconductor device may further comprise a step of forming a trench at the non-covered surface, this trench extending from the surface of the semiconductor layer to the first conductor layer, and a step of filling a low-resistance conducting material into the trench.

By performing the aforementioned manufacturing step, it is possible to form a conducting region formed from the low-resistance conducting material.

According to the semiconductor device of the present invention, the direction in which crystal defects extend and the direction of an electric field operating in a functional semiconductor structure are approximately orthogonal, and consequently it is possible to avoid the reduction in withstand voltage of the semiconductor device that is caused by these crystal defects. Further, the direction in which the crystal defects extend and the direction in which carriers flow between a pair of main electrodes are approximately orthogonal. Consequently it is possible to avoid current leakage that is caused by these crystal defects.

BRIEF DESCRIPTION OF THE DRAWINGS

FIG. 1 (*b*) shows a plan view of essential parts of the semiconductor device of the first embodiment.

BEST MODE FOR CARRYING OUT THE INVENTION

Important features of the embodiments will be noted.

(First feature) Carriers that move between a pair of main electrodes move within a drift layer along a direction approximately perpendicular to a direction in which crystal defects extend.

(Second feature) When the semiconductor device is off, an equipotential line formed in the drift layer extends approximately parallel to the direction in which the crystal defects extend.

(Third feature) The drift region extends above a top surface of an insulating layer in a region including the non-covered surface and a periphery of the non-covered surface.

(Fourth feature) The drift region has a flat shape extending in a planar manner.

(Fifth feature) A channel forming region makes a loop around a periphery of the drift region.

(Sixth feature) A source region makes a loop around a periphery of the channel forming region.

(Seventh feature) A source electrode is formed at a surface of a semiconductor layer formed on the surface of the insulating layer, and is formed at a location separated from the non-covered surface.

(Eighth feature) A semiconductor layer made from a III-V semiconductor material.

(Ninth feature) A semiconductor layer made from a III-V nitride semiconductor material.

Embodiments will be described in detail below with reference to the figures.

First Embodiment

Figure 1:
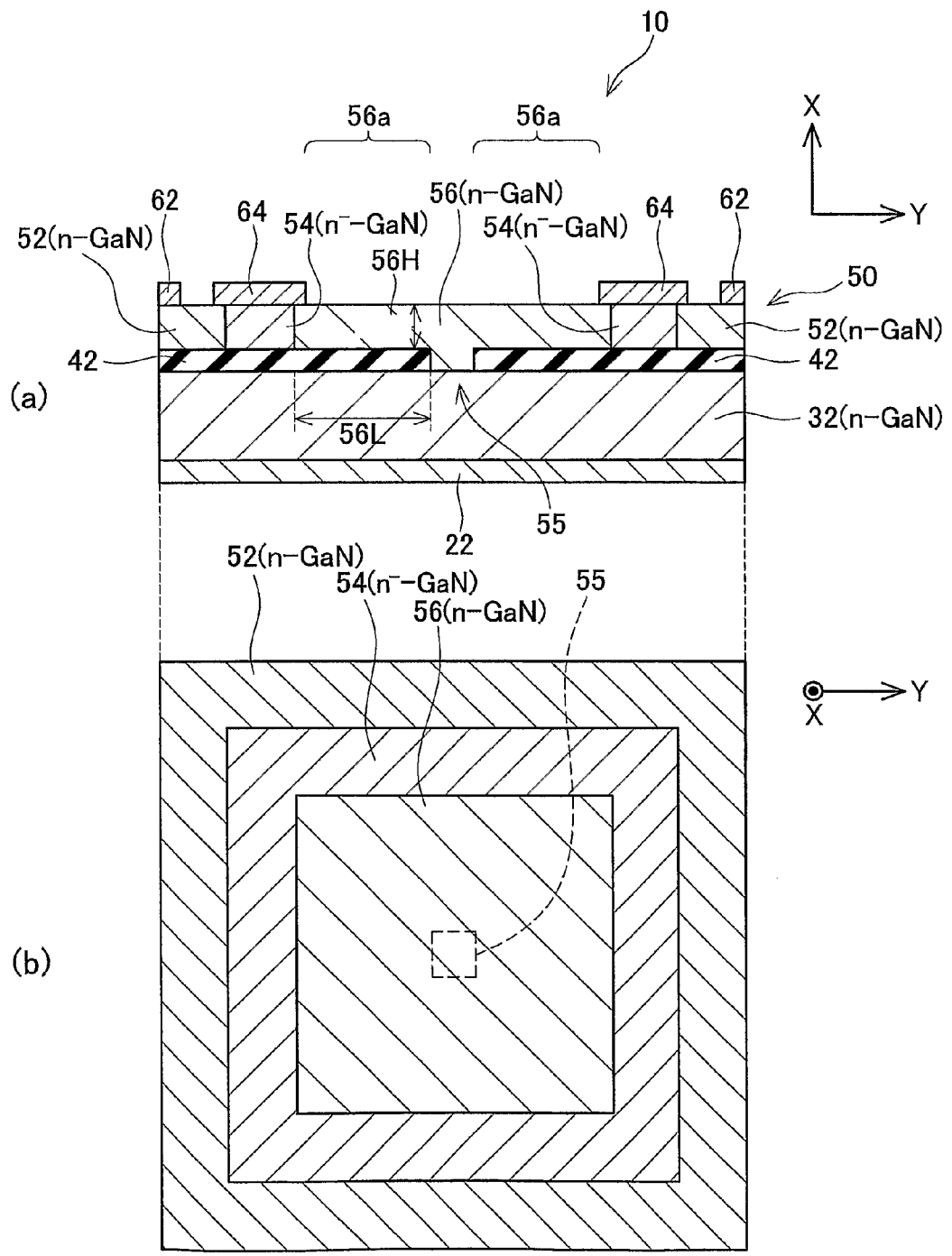
FIG. 1 (*a*) shows a cross-sectional view of essential parts of a semiconductor device of a first embodiment.

FIG. 1 (*a*) shows a cross-sectional view of essential parts of a semiconductor device 10. FIG. 1 (*b*) shows a plan view of essential parts of the semiconductor device 10. The plan view of essential parts of FIG. 1 (*b*) shows a state in which a source electrode 62 and a gate electrode 64, formed on a top surface of the semiconductor device 10, have been removed.

The semiconductor device 10 comprises a semiconductor base plate 32 made from n-GaN (gallium nitride). A drain electrode 22 made from, for example, aluminum, is formed by the vapor deposition method on a bottom surface of the semiconductor base plate 32. Impurity concentration of the semiconductor base plate 32 is adjusted to be high, and resistance of the semiconductor base plate 32 is low. The drain electrode 22 and the semiconductor base plate 32 are used while connected to a terminal of a power source, this terminal having positive polarity.

A top surface of the semiconductor base plate 32 is covered by an insulating layer 42 (an example of an electric current regulation layer) made from silicon oxide (SiOx), this extending in a planar manner and leaving a non-covered surface 55 at a window of the insulating layer 42. A top surface of the insulating layer 42 is covered by a semiconductor layer 50. The semiconductor layer 50 fills the window of the insulating layer 42 and contacts with the semiconductor base plate 32 at the non-covered surface 55. The semiconductor layer 50 is divided into a drift region 56 (an example of a first conductor region), a channel forming region 54 (an example of an intermediate region), and a source region 52 (an example of a second conductor region). More specifically, the drift region 56 is made from n-GaN and is formed at a portion of the semiconductor layer 50 close to the non-covered surface 55. The drift region 56 is also formed in a region above the non-covered surface 55, and is connected with the semiconductor base plate 32 via the non-covered surface 55. Viewed from a plan view, the drift region 56 extends from the non-covered surface 55 towards a periphery. The plan shape of the drift region 56 is rectangular. A part of the drift region 56 above the non-covered surface 55 is a part that electrically connects the semiconductor base plate 32 with the semiconductor layer 50. In the present specification, this part is termed a conducting region.

The source region 52 is made from n-GaN and is formed at a side of the semiconductor layer 50 far from the non-covered surface 55. The source region 52 is located at a position separated from the non-covered surface 55. The channel forming region 54 is formed between the drift region 56 and the source region 52. The channel forming region 54 is adjusted to have a lower concentration of n-type impurities than the drift region 56 made from n-GaN and the source region 52 made from n-GaN. The channel forming region 54 forms a loop around the drift region 56. The source region 52 forms a loop around an outer side of the channel forming region 54. The channel forming region 54 separates the drift region 56 and the source region 52. The drift region 56 and the source region 52 are completely separated by the channel forming region 54. The gate electrode 64 is made from poly-silicon and forms a Schottky contact with a top surface of the channel forming region 54. The gate electrode 64 forms a loop along the channel forming region 54. The source electrode 62 (an example of a second conductor layer) is made from aluminum and makes ohmic contact with a top surface of the source region 52. The source electrode 62 forms a loop along the source region 52.

The drift region 56, the channel forming region 54, and the source region 52 are formed by the epitaxial lateral overgrowth method, and have few crystal defects. However, there is not a total absence of crystal defects. The majority of the crystal defects that are present extend in a direction perpendicular to the surface of the insulating layer 42. That is, the crystal defects extend in the X direction.

A part of the semiconductor base plate 32 is exposed to the semiconductor layer 50 at the non-covered surface 55. As a result, the drain electrode 22 makes electrical contact with the drift region 56 via the non-covered surface 55.

In the semiconductor device 10, the source electrode 62 is disposed at the top surface of the semiconductor device 10 and the drain electrode 22 is disposed at the bottom surface of the semiconductor device 10. The semiconductor device 10 has a vertical electrodes structure. Consequently, it is easy to maintain insulation between the source electrode 62 and the drain electrode 22. Further, wiring (not shown) extends from both the source electrode 62 and the drain electrode 22. Because the source electrode 62 and the drain electrode 22 are formed at different faces, it is easy to keep the wiring insulated. Moreover, since the wiring layout of the electrode wiring can easily be simplified, it is possible to form electrode wiring that has a short length. Resistance caused by the wiring can thus be reduced.

Figure 2:
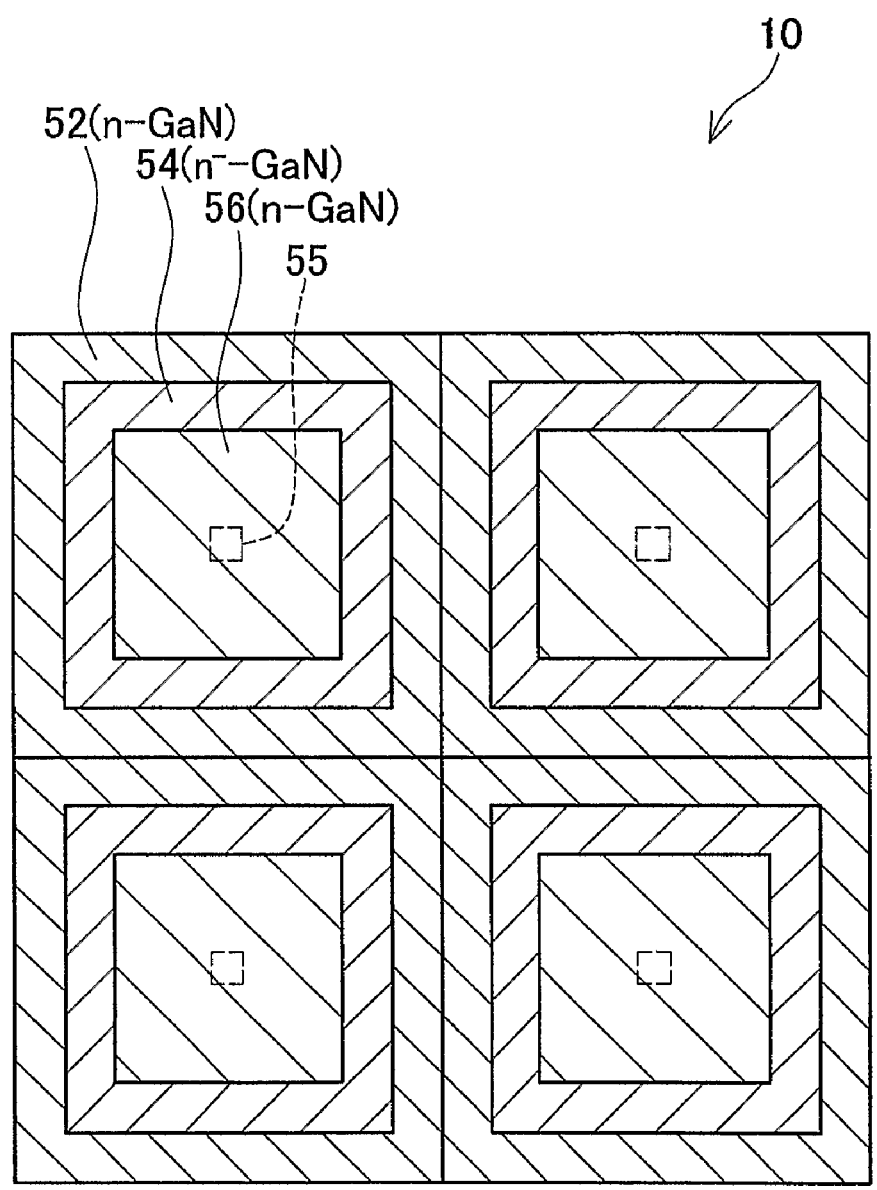
FIG. 2 shows a plan view of the semiconductor device of the first embodiment.

As shown in FIG. 2, the semiconductor device 10 includes a plurality of unit structures, each unit structure including the source electrode 62, the source region 52, the channel forming region 54, the drift region 56, the semiconductor base plate 32, and the drain electrode 22. The semiconductor base plate 32 and the drain electrode 22 may be used commonly among the plurality of unit structures. The unit structures are repeated adjacent to one another. In FIG. 2, a representative example is shown which has four unit structures. However, more unit structures may be repeated along the up-down and left-right directions of the plane of the page.

Next, operation when the semiconductor device 10 is on will be described using FIG. 1.

In the semiconductor device 10, the source region 52, the channel forming region 54, and the drift region 56 are formed with the same conductivity type. As a result, the semiconductor device 10 operates as a normally on type. Electric current flows even if voltage is not being applied to the gate electrode 64. However, in order to lower on resistance, it is preferred that voltage is applied to the gate electrode 64. For example, when +1 V drain voltage is applied to the drain electrode 22, the source electrode 62 is earthed, and +1 V gate voltage is applied to the gate electrode 64, an accumulated layer of electrons is formed near the surface of the channel forming region 54 facing the gate electrode 64. The semiconductor device 10 thus has a sufficiently on state. The electrons move from the source region 52 to the drift region 56 via the accumulated layer of the channel forming region 54. The electrons, which have moved in a horizontal direction within the drift region 56 that extends in a planar manner, move via the non-covered surface 55 to the semiconductor base plate 32 at the bottom surface side, and finally move to the drain electrode 22.

In the semiconductor device 10, the drain electrode 22 is formed on the entire bottom surface of the semiconductor base plate 32. As a result, a comparatively large current can be handled superior efficiency per a unit area can be obtained.

Next, operation when the semiconductor device 10 is off will be described.

When the voltage applied to the gate electrode 64 is changed from +1 V to −10 V, a depleted layer caused by the Schottky contact is formed within the channel forming region 54. This depleted layer intercepts the flow of carriers, thereby changing the semiconductor device from the on state to an off state. Further, in the semiconductor device 10, the depleted layer caused by the Schottky contact also extends in a horizontal direction within the drift region 56. When the impurity concentration, etc. of the drift region 56 has been adjusted appropriately, the depleted layer can extend across a wide area of the drift region 56. In the case of the present embodiment, the depleted layer extends from the region making contact with the gate electrode 64 to the edge of the non-covered surface 55 of the insulating layer 42 (the range indicated by the reference number 56a) when the semiconductor device 10 is off.

In the semiconductor device 10, a distance (56L) from a boundary between the channel forming region 54 and the drift region 56 to the edge of the non-covered surface 55 is at least 3 times greater than a thickness (56H) of the drift region 56. That is, the drift region 56 extends in a planar manner, and has a flat shape. As a result, the electric field caused by the voltage difference applied to the drift region 56 in the range of the reference number 56a is formed in a horizontal direction with respect to the drift region 56. That is, an approximately orthogonal relationship is obtained between the direction in which the crystal defects extend within the drift region 56 (X direction in FIG. 1) and the direction of the electric field (Y direction in FIG. 1). In other words, an equipotential line is approximately parallel to the direction in which the crystal defects extend within the drift region 56. When the direction in which the crystal defects extend within the drift region 56 is approximately orthogonal to the direction of the electric field, the effects of the crystal defects are not readily felt, and a high electric field can be maintained in the drift region 56. In the semiconductor device 10, the reduction in withstand voltage based on the crystal defects can be suppressed in spite of the presence of these crystal defects.

Furthermore, the semiconductor device 10 has the characteristic that current leakage in the channel forming region 54 is reduced. This is because, in the channel forming region 54 also, an approximately orthogonal relationship is obtained between the direction in which the crystal defects extend (X direction) and the direction of the electric field (Y direction). Consequently current leakage can be depressed. As a result, it is possible to accurately control on/off of the semiconductor device 10 and to control the amount of electric current.

Further, the semiconductor device of the present embodiment has a vertical electrodes structure, and it is easy to apply a high voltage to the insulating layer 42. As a result, it is preferred that material with a large dielectric breakdown electric field is used for the insulating layer 42. Typically, silicon oxide is suitable for use as the insulating layer 42.

The first embodiment may have the following variants.

(1) A p type semiconductor region may be formed in part of a region of the drift region 56, this region being outside the range of the region 56a where the depleted layer is formed (in this example, this is the region inwards from the edge of the non-covered surface 55 of the drift region 56 and above the non-covered surface 55). A semiconductor device of this mode can supply positive holes from the p type semiconductor region. As a result, the semiconductor device of this mode is capable of bipolar operation. Consequently, the positive holes supplied from the p type semiconductor region energize conductivity modulation in the drift region 56. With the semiconductor device of this mode, on resistance can be reduced further.

(2) Aluminum nitride may be used for forming the insulating layer 42. Aluminum nitride efficiently conducts heat which is generated at the top surface side of the electric current regulation layer, towards the bottom surface side. A semiconductor device can be obtained in which stable operation is realized.

(3) A p type semiconductor region may be formed in a local region of the electric current regulation layer 42 side of the drift region 56 or the channel forming region 54. In this case, a depleted layer is formed from a pn junction between the p type semiconductor region and the channel forming region 54 or the drift region 56, and the withstand voltage of the semiconductor device can be increased.

Figure 3:
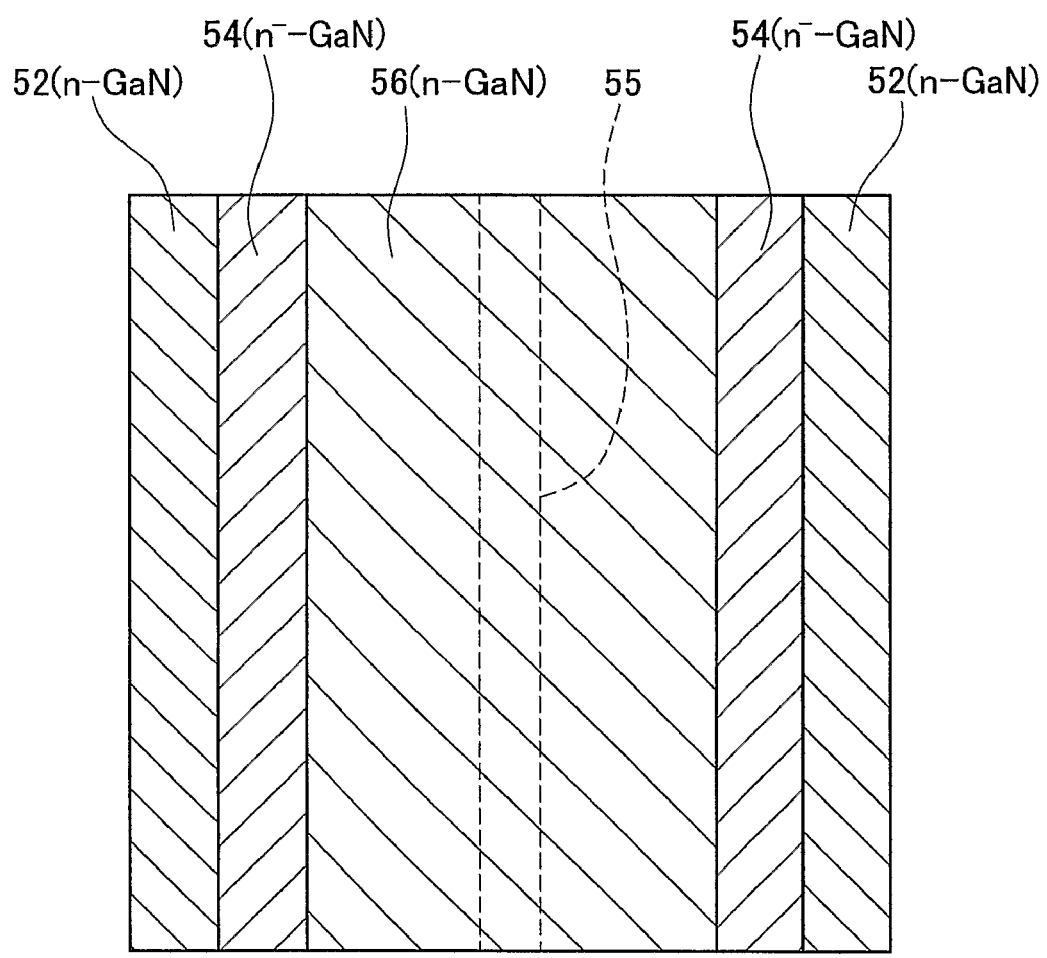
FIG. 3 shows a plan view of essential parts of a variant semiconductor device.

(4) Instead of the channel forming region 54, the source region 52, etc. being formed as a square loop, these regions may be formed in other polygonal shapes, as concentric circles, or in a striped shape. FIG. 3 shows a plan view of essential parts of a variant example in which these regions have been formed in a striped shape. A longitudinal section of this variant example is equivalent to FIG. 1 (*a*). By forming the striped shape, it is possible to simplify the alignment of the electrodes, etc. formed on the surface of the semiconductor layer 50.

Figure 4:
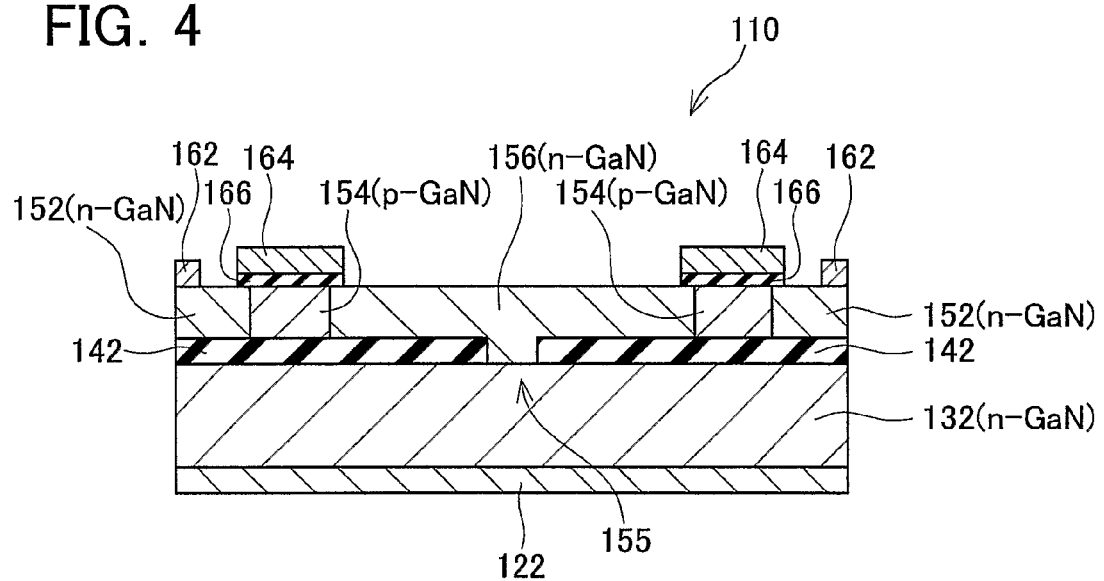
FIG. 4 shows a cross-sectional view of essential parts of a variant comprising a MOS structure.

(5) A semiconductor device 110, which is shown in a cross-sectional view of essential parts in FIG. 4, is an example in which the gate structure is a MOS type. In the semiconductor device 110, a channel forming region 154 has a p conductivity type, and a gate insulating film 166 is formed between the channel forming region 154 and a gate electrode 164. The remaining configuration is the same as the semiconductor device 10. As shown in FIG. 4, the gate electrode 164 faces the channel forming region 154 via the gate insulating film 166, and normally-off operation can be realized.

Figure 5:
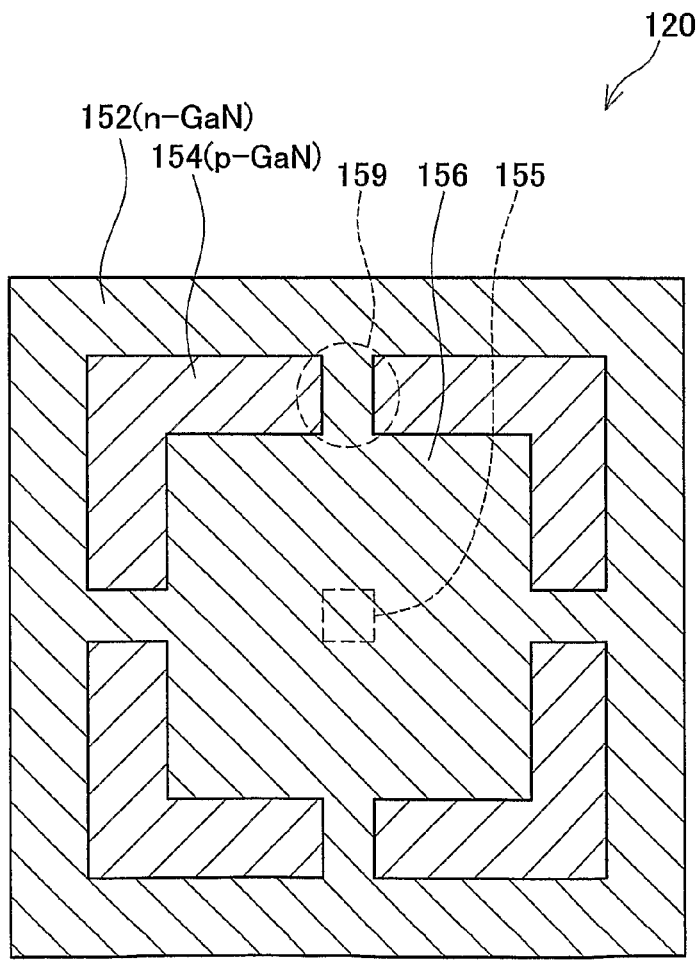
FIG. 5 shows a plan view of essential parts of a variant comprising a JFET structure.

(6) A semiconductor device 120, a plan view of essential parts thereof being shown in FIG. 5, is a semiconductor device that has a JFET structure. In the semiconductor device 120, as shown in FIG. 5, a channel controlling region 154 has a p conductivity type. A plurality of channel controlling regions 154 are dispersed between a part close to a non-covered surface 155 and a part far from the non-covered surface 155. The channel controlling regions 154 face one another and are separated by minute gaps 159 that work as channel forming regions. A gate electrode (not shown) makes electrical contact with the channel controlling regions 154. By adjusting gate voltage applied to the gate electrode, a width of a depleted layer that extends from a pn junction boundary of both sides of the gaps 159 can be adjusted. Consequently, by adjusting the gate voltage, it is possible to control on/off of the electric current flowing between the source electrode and the drain electrode, and to control the amount of electric current.

Figure 6:
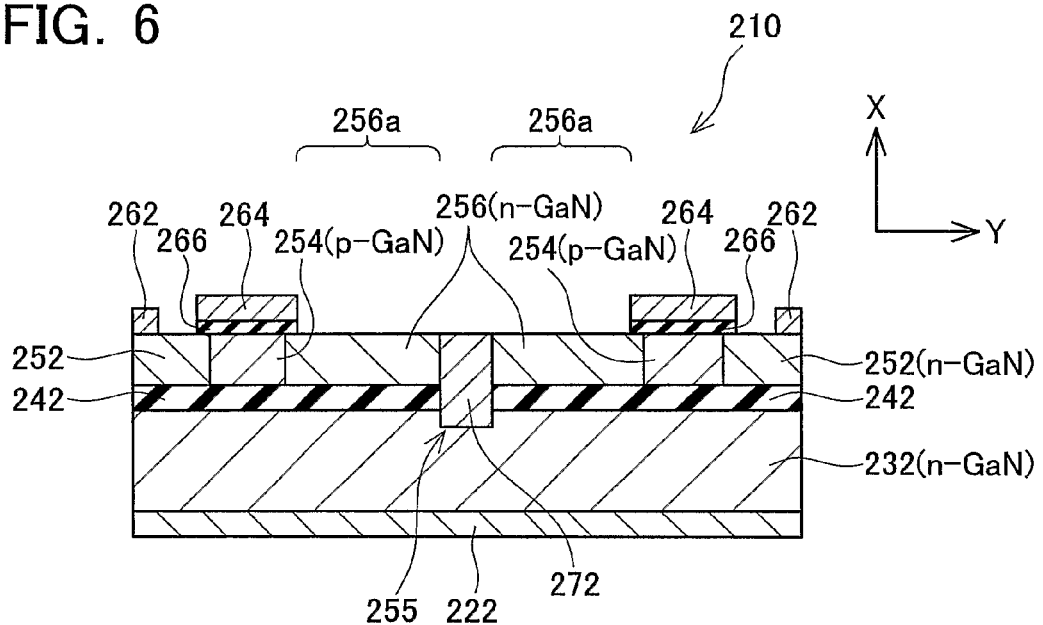
FIG. 6 shows a cross-sectional view of essential parts of a variant comprising a metal region.

(7) As shown in FIG. 6, a metal region 272 made from aluminum (an example of a low-resistance conducting material) may be formed in a region (a conducting region) that includes a non-covered surface 255. The metal region 272 extends from a surface of a drift region 256 to a semiconductor base plate 232. The metal region 272 is formed in a local region, and does not interfere with the majority of the drift region 256. A depleted layer formed when the semiconductor device has been turned off, shown by the reference number 256a, extends within the range of the drift region 256, and does not reach the region where the metal region 272 is formed. Alternatively, impurity concentration, etc. of a channel forming region 254 and the drift region 256 may be adjusted such that the depleted layer will not reach the region where the metal region 272 is formed. As a result, the withstand voltage of the semiconductor device is not reduced even though the metal region 272 has been formed. Further, electrons can move easily via the metal region 272 when the semiconductor device has been turned on. On resistance is lowered in this variant semiconductor device.

The technical elements in the aforementioned variants may be realized separately or in all types of conjunctions.

Next, a method of manufacturing the variant having the metal region 272 shown in FIG. 6 will be described with reference to FIGS. 7 to 11. The major part of the technique and sequence of the manufacturing method of this variant can be utilized for the semiconductor device 10 of the first embodiment, or for the other variants thereof.

Figure 7:
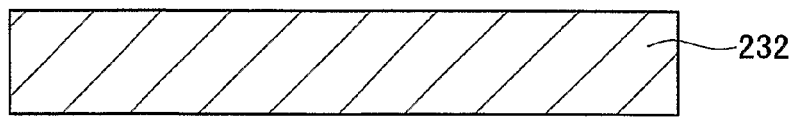
FIG. 7 shows a first state of a manufacturing process of the valiant comprising the metal region.

First, as shown in FIG. 7, the semiconductor base plate 232 made from n-GaN (gallium nitride) is prepared. Crystal defects pass through the entire semiconductor base plate 232 in its direction of thickness (the up-down direction of the face of the page). A base plate may also be used formed from materials such as silicon (Si), silicon carbide (SiC), etc. instead of gallium nitride.

Figure 8:
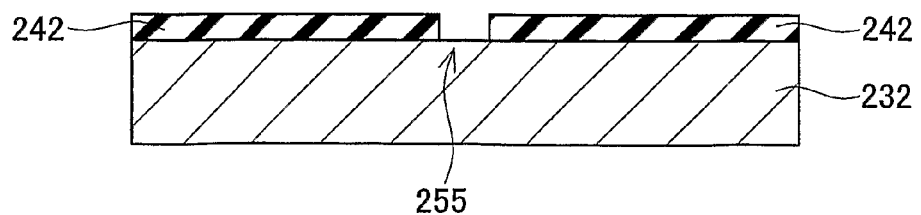
FIG. 8 shows a second state of the manufacturing process of the variant comprising the metal region.

Next, as shown in FIG. 8, an insulating layer 242 made from aluminum nitride is formed on the semiconductor base plate 232 by the sputter method or the CVD method, leaving the non-covered surface 255. SiOx may be used instead of aluminum nitride.

Figure 9:
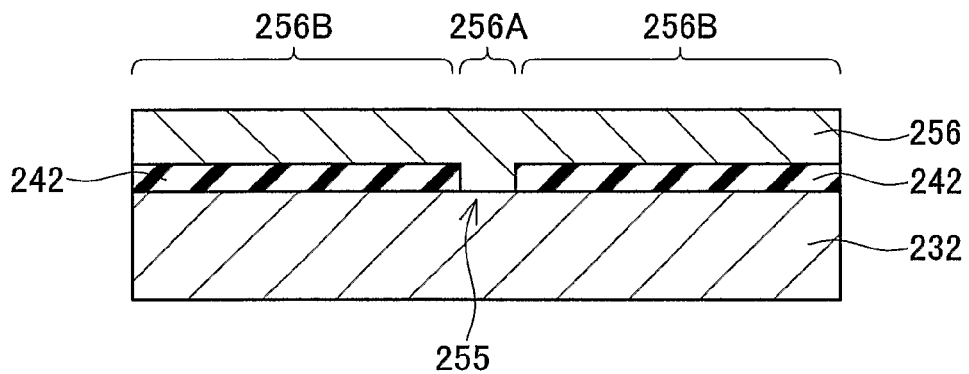
FIG. 9 shows a third state of the manufacturing process of the variant comprising the metal region.

Next, as shown in FIG. 9, the semiconductor layer 256 made from n-GaN is formed, using the organometallic vapor phase epitaxy method, from the surface of the semiconductor base plate 232 exposed at the non-covered surface 255 of the insulating layer 242. At this juncture, trimethyl gallium (TMGa) may suitably be used as the gallium raw material, ammonia gas ($NH_3$) may suitably be used as the nitrogen raw material, and monosilane ($SiH_4$) may suitably be used as the dopant material.

The epitaxial lateral overgrowth method may suitably be used in the step of forming the semiconductor layer 256. In the epitaxial lateral overgrowth method, which uses the organometallic vapor phase epitaxy method, crystals are grown by means of a chemical reaction between III group organic metals and V group hydrides in a hydrogen environment. When the semiconductor layer 256 is grown by the epitaxial lateral overgrowth method, the GaN crystals that are grown from the non-covered surface 255 of the insulating layer 242 in the direction of thickness (the up-down direction of the face of the page) do not have a nucleon constant, etc. equivalent to the semiconductor base plate 232. Consequently, there are many crystal defects, and the crystal defects pass through the semiconductor layer 256 in its direction of thickness (the range shown by the reference number 256A). Since GaN crystals cannot be grown from the insulating layer 242 in the region above this insulating layer 242, the GaN crystals grow in a horizontal direction. After growing in a horizontal direction, the crystals can also be grown in a vertical direction by adjusting the growth conditions, etc. The region above the insulating layer 242 is a region through which comparatively few crystal defects pass in the direction of thickness (the area shown by the reference number 256B).

Figure 10:
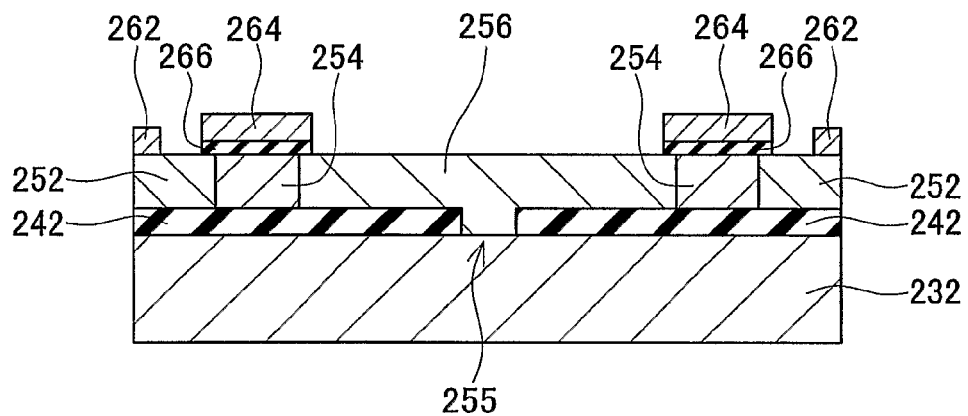
FIG. 10 shows a fourth state of the manufacturing process of the variant comprising the metal region.

Next, as shown in FIG. 10, p type impurities are implanted in the semiconductor layer 256 that does not include the non-covered surface 255 until the conductivity type is reversed, thus forming the channel forming region 254. The channel forming region 254 is formed at a location separated by a predetermined distance from the edge of the non-covered surface 255. A region inwards from the channel forming region 254 forms the drift region 256, and a region outwards from the channel forming region 254 forms the source region 252.

In the case where the semiconductor device 10 of the first embodiment shown in FIG. 1 is manufactured, a channel forming region with a low concentration of n type impurities can be formed by implanting p type impurities, but not to the extent that reversal occurs. Alternatively, the concentration of n type impurities in the channel forming region can be made lower than the other semiconductor layers by implanting n type impurities in the drift region and the source region.

Next, a source electrode 262 is formed on a surface of the source region 252 using the photo technique and the etching technique. A contact region having a high concentration of n type impurities may be formed within the source region 252 so that there is good electrical contact between the source region 252 and the source electrode 262.

Next, a gate insulating film 266 made from silicon oxide and a gate electrode 264 made from polysilicon are formed on a surface of the channel forming region 254 using the photo technique and the etching technique.

Figure 11:
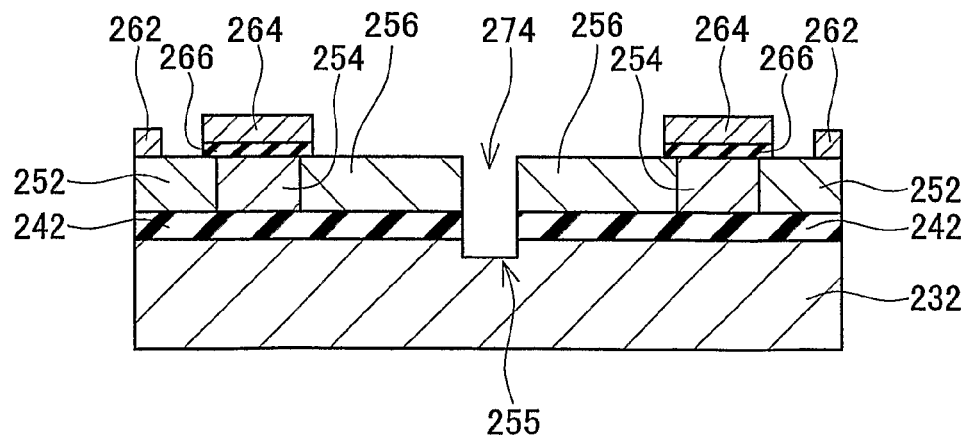
FIG. 11 shows a fifth state of the manufacturing process of the variant comprising the metal region.

Next, as shown in FIG. 11, a trench 274 is formed, using the photo technique and the etching technique, from a surface of the drift region 256 towards the non-covered surface 255 of the insulating layer 242. Next, aluminum is grown within the trench 274 using, for example, the CVD method. Then aluminum is vapor deposited on a bottom surface of the semiconductor base plate 232, allowing a semiconductor device having the metal region 272 shown in FIG. 6 to be obtained.

Instead of the manufacturing method described above, the metal region 272 may be formed first, and ion implantation of the channel forming region 254, and the formation of the source electrode 262 and the gate electrode 264 may then be performed.

In the manufacturing method of the semiconductor device described above, the step of forming the metal region 272 has the following characteristics. The trench 274 within the metal region 272 is frequently formed using, for example, dry etching of the RIE (Reactive Ion Etching) method. However, when dry etching of the RIE method is performed on a semiconductor layer comprising GaN, the GaN usually undergoes a strong change towards n type. As a result, in normal semiconductor devices, there is the concern that this n type change may cause a deterioration in characteristics, such as increasing electric current leakage, lowering withstand voltage, increasing resistance, etc. However, in the aforementioned semiconductor device, the region in which the trench 274 is manufactured differs from the region (the drift region) in which voltage is maintained between a pair of main electrodes. Further, the region also differs from a region for controlling the electric current, and consequently the aforementioned concern does not arise. There is no deterioration of the characteristics of the semiconductor device, and a semiconductor device provided with the metal region 272 can be obtained.

Second Embodiment

Figure 12:
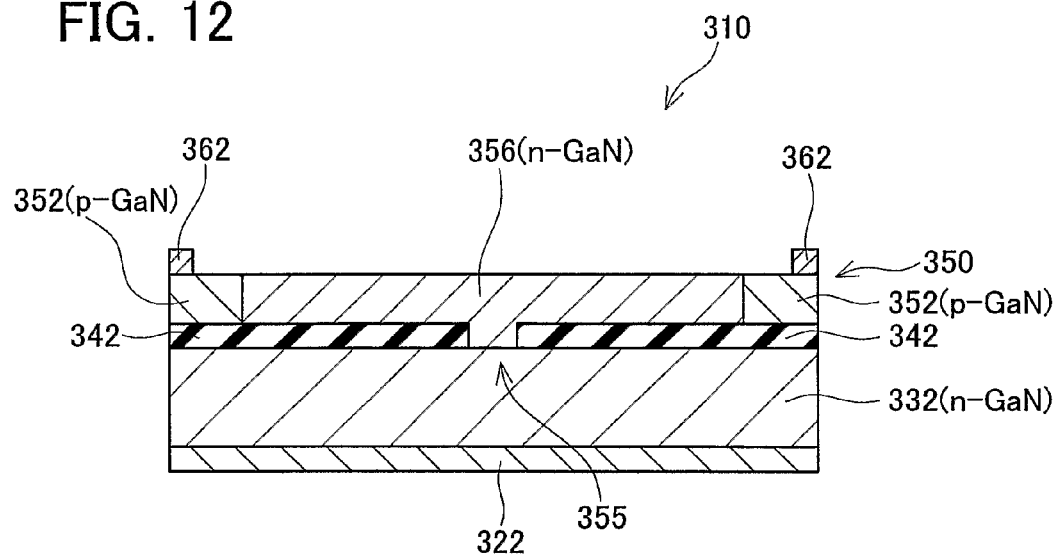
FIG. 12 shows a cross-sectional view of essential parts of a semiconductor device of a second embodiment.

FIG. 12 shows a cross-sectional view of essential parts of a semiconductor device 310. The semiconductor device 310 comprises a diode structure. Further, a description may be omitted of structures that are approximately the same as the first embodiment.

The semiconductor device 310 has a semiconductor base plate 332 made from n-GaN. A cathode electrode 322 made from, for example, aluminum, is formed by the vapor deposition method on a bottom surface of the semiconductor base plate 332. The impurity concentration of the semiconductor base plate 332 is adjusted to be high, and resistance of the semiconductor base plate 332 is low. When on, the cathode electrode 322 and the semiconductor base plate 332 are connected with a terminal of a power source, this terminal having a negative polarity. When off, the cathode electrode 322 and the semiconductor base plate 332 are connected with a terminal of the power source, thus terminal having a positive polarity.

A top surface of the semiconductor base plate 332 is covered by an insulating layer 342 (an example of an electric current regulation layer) formed from aluminum nitride (AlN), this extending in a planar manner and leaving a non-covered surface 355. A top surface of the insulating layer 342 is covered by a semiconductor layer 350. The semiconductor layer 350 has a cathode region 356 (an example of a first conductor region) and an anode region 352 (an example of a second conductor region). The cathode region 356 is made from n-GaN (gallium nitride) and is formed at a part of the semiconductor layer 350 close to the non-covered surface 355. The cathode region 356 is also formed in a region including the non-covered surface 355, and is connected with the semiconductor base plate 332 via the non-covered surface 355. Viewed from a plan view, the cathode region 356 extends from the non-covered surface 355 towards a periphery. The plan shape of the cathode region 356 is rectangular. The anode region 352 is made from p-GaN and is formed at a part of the semiconductor layer 350 far from the non-covered surface 355. The anode region 352 forms a loop around the cathode region 356. When the cathode region 356 and the anode region 352 are viewed from a plan view, the anode region 352 forms a loop around the periphery of the rectangular cathode region 356. An anode electrode 362 made from aluminum makes ohmic contact at a top surface of the anode region 352. The anode electrode 362 forms a loop along the anode region 352.

The cathode region 356 and the anode region 352 are formed by the epitaxial lateral overgrowth method, and have few crystal defects. However, there is not a total absence of crystal defects. The majority of the crystal defects that are present extend in a direction perpendicular to the surface of the insulating layer 342.

When voltage more positive than the anode electrode 362 is applied to the cathode electrode 322, a pn junction of the cathode region 356 and the anode region 352 have an inverted bias, and consequently the semiconductor device assumes an off state. At this juncture, a depleted layer is formed from a pn junction boundary between the anode region 352 and the cathode region 356. The depleted layer extends in a horizontal direction within the cathode region 356. By adjusting the distribution, shape, etc. of impurities in the cathode region 356, the depleted layer is formed across a wide range of the cathode region 356. Due to the depleted layer, it is possible to maintain most of the electric field generated by the voltage difference between the pair of main electrodes within the cathode region 356 above the insulating layer 342. Since the cathode region 356 of the semiconductor device 310 has a flat shape, the voltage difference is formed in a horizontal direction from the pn junction boundary. As a result, an orthogonal relationship is obtained between the direction of crystal defects and the direction of the electric field within the cathode region 356. The cathode region 356 is thus not readily affected by the crystal defects, and consequently a high electric field can be maintained in the cathode region 356. The semiconductor device 310 is thus prevented from having a reduced withstand voltage caused by the crystal defects.

When a voltage more positive than the cathode electrode 322 is applied to the anode electrode 362, a sequential bias is caused of the pn junction of the anode region 352 and the cathode region 356, and consequently the semiconductor device assumes an on state.

The second embodiment may have the following variants.

(1) Instead of the cathode layer 356 being formed as a rectangular shape and the anode region 352 being formed as a ring shape, these layers may be formed in other polygonal shapes, as concentric circles, or in a striped shape.

(2) A p type semiconductor region may be formed locally within the cathode region 356 at the electric current regulation layer 342 side. A depleted layer is formed within the cathode region 356 due to the p type semiconductor region, and the withstand voltage of the semiconductor device can be increased. The technical elements in the aforementioned variants may be realized separately or in all types of conjunctions.

Third Embodiment

Figure 13:
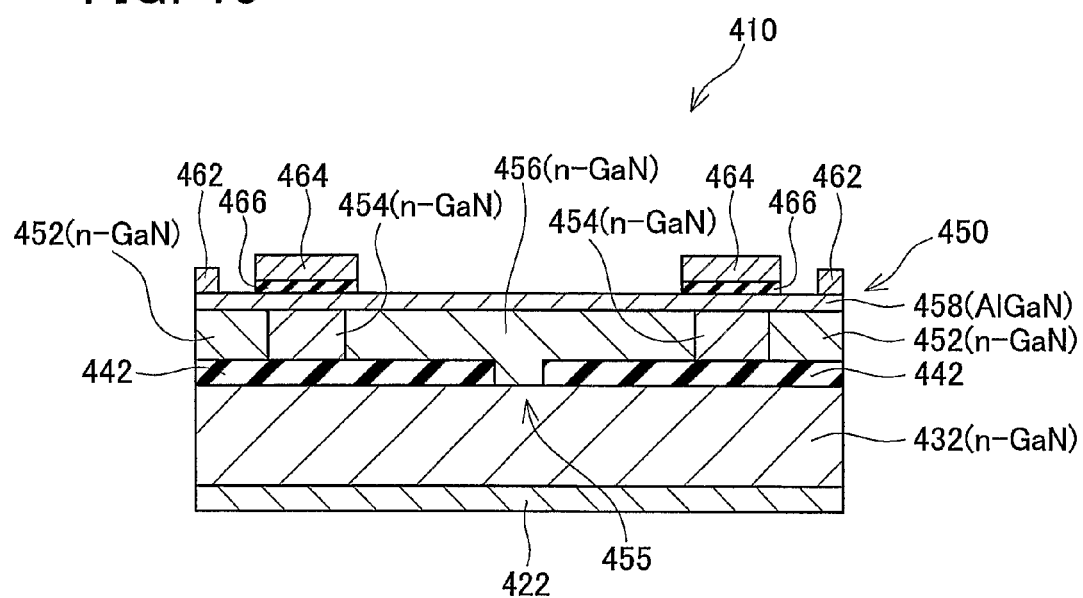
FIG. 13 shows a cross-sectional view of essential parts of a semiconductor device of a third embodiment.

FIG. 13 shows a cross-sectional view of essential parts of a semiconductor device 410. The semiconductor device 410 is an example of an HEMT (High Electron mobility transistor).

The semiconductor device 410 has a semiconductor base plate 432 made from n-GaN. A drain electrode 422 made from, for example, aluminum, is formed by the vapor deposition method on a bottom surface of the semiconductor base plate 432. The impurity concentration of the semiconductor base plate 432 is adjusted to be high, and resistance of the semiconductor base plate 432 is low. When being used, the drain electrode 422 and the semiconductor base plate 432 are connected with a terminal of a power source, this terminal having a positive polarity.

A top surface of the semiconductor base plate 432 is covered by an insulating layer 442 (an example of an electric current regulation layer) formed from aluminum nitride (AlN), this extending in a planar manner and leaving a non-covered surface 455. A top surface of the insulating layer 442 is covered by a semiconductor layer 450. The semiconductor layer 450 has a lower semiconductor layer 456, 454, and 452 and an upper semiconductor layer 458 located on a top surface of the lower semiconductor regions 456, 454, and 452. The lower semiconductor layer may comprise a first lower semiconductor region 456, a second lower semiconductor region 454, and a third lower semiconductor region 452. The first lower semiconductor region 456 is made from n-GaN (gallium nitride) and is formed at a part of the lower semiconductor layer close to the non-covered surface 455. The first lower semiconductor region 456 is also formed within a region including the non-covered surface 455, and is connected with the semiconductor base plate 432 via the non-covered surface 455. Viewed from a plan view, the first lower semiconductor region 456 extends from the non-covered surface 455 towards a periphery. The plan shape of the first lower semiconductor region 456 is rectangular. The third lower semiconductor region 452 is made from n-GaN and is formed at a part of the semiconductor layer 450 far from the non-covered surface 455. The second lower semiconductor region 454 is formed between the first lower semiconductor region 456 and the third lower semiconductor region 452. The second lower semiconductor region 454 forms a loop around the first lower semiconductor region 456. The third lower semiconductor region 452 forms a loop around an outer side of the second lower semiconductor region 454. The first lower semiconductor region 456, the second lower semiconductor region 454, and the third lower semiconductor region 452 may be formed as one continuous uniform layer and their material and impurity concentration is identical. The separation of first to third lower semiconductor regions is not required.

The upper semiconductor layer 458 is made from AlGaN and is located on a top surface of the lower semiconductor regions 452, 454, and 456. Since the upper semiconductor layer 458 contains aluminum, a band gap of the upper semiconductor layer 458 is greater than a band gap of the lower semiconductor regions 452, 454, and 456.

A gate electrode 464 made from polysilicon is formed, via a gate insulating layer 466, on a top surface of the upper semiconductor layer 458 facing the second lower semiconductor region 454. The gate electrode 464 forms a loop along the second lower semiconductor region 454. A source electrode 462 is made from aluminum and makes ohmic contact with the surface of the upper semiconductor layer 458 that corresponds to the third lower semiconductor region 452. The source electrode 462 forms a loop along the source layer 452.

Crystal defects pass through the lower semiconductor layer (formed from the lower semiconductor regions 452, 454, and 456) in its direction of thickness (the up-down direction relative to the face of the page). The crystal defects extend in a direction perpendicular to the surface of the insulating layer 442. The lower semiconductor layer is formed from the non-covered surface 455 by the epitaxial lateral overgrowth method. Consequently, there is a higher concentration of crystal defects in the part of the lower semiconductor layer above the non-covered surface 455, and there is a lower concentration of crystal defects in the remainder of the lower semiconductor layer.

Owing to the difference in band gap between the lower semiconductor layer (formed from the lower semiconductor regions 452, 454, and 456) and the upper semiconductor layer 458, the semiconductor device 410 has a potential well formed at a boundary between the two. More accurately, the potential well is formed within the lower semiconductor layer 452, 454, and 456 at the boundary with the upper semiconductor layer 458. The potential well extends across the entirety of the lower semiconductor regions 452, 454, and 456. Two dimensional electron gas is generated in the potential well, this two dimensional electron gas moving rapidly in a horizontal direction within the potential well. The semiconductor device 410 is a normally on type. When voltage more positive than the source electrode 462 is applied to the drain electrode 422 and 0 V is applied to the gate electrode 464, the semiconductor device 410 assumes an on state. Electrons generated in the potential well below the source electrode 462 move in a horizontal direction within the potential well. When these electrons move to above the non-covered surface 455, the electrons move towards the non-covered surface 455 from within the potential well via the comparatively large number of crystal defects present above the non-covered surface 455. The electrons move via the non-covered surface 455 and via the semiconductor base plate 432 to the drain electrode 422.

The energy level of a potential well of the boundary between the upper semiconductor layer 458 and the second lower semiconductor region 454 below the gate electrode 464 is above the Fermi level when a negative voltage is applied to the gate electrode. As a result, a state is obtained in which the two dimensional electron gas cannot be present within the potential well. The electrons are thus prevented from moving in a horizontal direction, and consequently the semiconductor device 410 moves from the on state to an off state. In this off state, the direction of an electric field formed in the lower semiconductor layer is parallel to the surface of the insulating layer 442. An orthogonal relationship is thus obtained between the direction of the electric field and the direction in which the crystal defects extend. Since an orthogonal relationship is obtained between the direction of the electric field and the direction in which the crystal defects extend at the boundary between the upper semiconductor layer 458 and the second lower semiconductor region 454 below the gate electrode 464, current leakage in this region is reduced. It is possible to accurately control on/off of the semiconductor device 410 and the amount of electric current.

The third embodiment can have the following variants.

(1) The gate electrode 464 may make contact with the upper semiconductor layer 458 directly instead of via the gate insulating layer 466.

(2) It is preferred that the upper semiconductor layer 458 is formed quite thinly. In this case, when voltage is not being applied to the gate electrode 464, the potential well formed at the boundary between the upper semiconductor layer 458 and the lower semiconductor region 452, 454, and 456 obtains a state above the Fermi level. That is, normally off operation is realized. Alternatively, normally off operation may be realized by changing the conductivity type of the second lower semiconductor region 454 to the p type.

The electric current regulation layer may be made of an insulating material such as silicon oxide. The electric current regulation layer may be made of a semiconductor material having substantially no impurities. Alternatively, the electric current regulation layer may be made of a semiconductor material having impurities, the conductivity type of these impurities being different from impurities contained in the lower semiconductor layer of HEMT.

The technical elements in the aforementioned variants may be realized separately or in all types of conjunctions.

Representative embodiments of the present invention have been described in detail above. However, these merely illustrate some possibilities of the invention and do not restrict the claims thereof. The art set forth in the claims encompasses various transformations and modifications to the embodiments described above.

Furthermore, the technical elements disclosed in the present specification or figures may be utilized separately or in all types of conjunctions and are not limited to the conjunctions set forth in the claims at the time of filing the application. Furthermore, the art disclosed in the present specification or figures may be utilized to simultaneously achieve a plurality of aims or to achieve at least one of these aims.

The invention claimed is:

1. A semiconductor device comprising:
   a first electrode;
   a first conductor layer formed on the first electrode, the first conductor layer being made of a semiconductor material with a uniform concentration of impurities along a thickness direction and being in ohmic contact with the first electrode;
   an electric current regulation layer covering a part of a surface of the first conductor layer and leaving a non-covered surface at the surface of the first conductor layer;

a semiconductor layer covering a surface of the electric current regulation layer;
a conducting region connecting the semiconductor layer to the first conductor layer at the non-covered surface;
a control electrode facing an intermediate portion of the semiconductor layer, the intermediate portion being separated laterally from the non-covered surface by a first portion of the semiconductor layer, the first portion extending vertically from a surface of the electric current regulation layer to a top surface of the semiconductor layer; and
a second electrode formed at a surface of the semiconductor layer, the second electrode being located at a position separated laterally from the non-covered surface,
wherein
a semiconductor structure constructed by a plurality of semiconductor regions is formed within the semiconductor layer,
a depletion layer is disposed within the first portion at non-conduction state, and
the first portion has a length extending between the intermediate portion and the non-covered surface, the length being at least three times greater than a thickness of the first portion.

2. A semiconductor device as defined in claim 1,
wherein the semiconductor structure formed within the semiconductor layer comprises:
a first semiconductor region located at the first portion;
a second semiconductor region located at a second portion of the semiconductor layer, the second portion located between the intermediate portion and the second electrode; and
an intermediate semiconductor region located at the intermediate portion,
wherein
the first semiconductor region has a higher concentration of impurities of a first conductivity type,
the second semiconductor region has a higher concentration of impurities of the first conductivity type, and
the intermediate semiconductor region has a lower concentration of impurities of the first conductivity type.

3. A semiconductor device as defined in claim 1,
wherein the semiconductor structure formed within the semiconductor layer comprises:
a first semiconductor region located at the first portion, the first semiconductor region having impurities of a first conductivity type;
a second semiconductor region located at a second portion of the semiconductor layer, the second portion located between the intermediate portion and the second electrode, the second semiconductor region having impurities of the first conductivity type; and
an intermediate semiconductor region located at the intermediate portion, the intermediate semiconductor region having impurities of a second conductivity type.

4. A semiconductor device as defined in claim 1,
wherein the control electrode faces the intermediate portion via an insulating layer.

5. A semiconductor device as defined in claim 1,
wherein the control electrode is in contact with the intermediate semiconductor region.

6. A semiconductor device as defined in claim 3,
wherein the control electrode is in contact with the intermediate semiconductor region.

7. A semiconductor device as defined in claim 1,
wherein the semiconductor structure formed within the semiconductor layer comprises:
a first semiconductor region located at the first portion, the first semiconductor region having impurities of a first conductivity type;
a second semiconductor region located at a second portion of the semiconductor layer, the second portion located between the intermediate portion and the second electrode, the second semiconductor region having impurities of the first conductivity type;
a plurality of intermediate semiconductor regions distributed at the intermediate portion, the intermediate semiconductor regions having impurities of a second conductivity type, and
a gap region interposed between the intermediate semiconductor regions, the gap region having impurities of the first conductivity type,
wherein the control electrode is connected to the intermediate semiconductor regions.

8. A semiconductor device as defined in claim 1,
wherein the electric current regulation layer is made of an insulating material.

9. A semiconductor device as defined in claim 8, wherein the electric current regulation layer is mainly made of silicon oxide.

10. A semiconductor device as defined in claim 1,
wherein the electric current regulation layer is made of a semiconductor material having substantially no impurities.

11. A semiconductor device as defined in claim 1,
wherein the electric current regulation layer is made of a semiconductor material having impurities, the conductivity type of these impurities being different from impurities contained in a lower semiconductor layer.

12. A semiconductor device as defined in claim 1,
wherein the semiconductor layer comprises a III-V semiconductor.

13. A semiconductor device as defined in claim 12,
wherein the first conductor layer comprises a Ill-V semiconductor region exposed at the non-covered surface.

14. A semiconductor device as defined in claim 1, wherein the conducting region is made of the same material as the semiconductor layer.

15. A semiconductor device as defined in claim 1,
wherein the conducting region is mainly made of a low-resistance conducting material.

16. A semiconductor device as defined in claim 15,
wherein the conducting region extends from the surface of the semiconductor layer to the first conductor layer exposed at the non-covered surface.

17. A method of manufacturing a semiconductor device of claim 1, comprising:
a step of forming an electric current regulation layer on a part of a surface of a first conductor layer leaving a non-covered surface;
a step of growing a semiconductor layer comprising a III-V semiconductor covering the electric current regulation layer from the surface of the first conductor layer exposed at the non-covered surface; and
a step of forming a semiconductor structure in the semiconductor layer on the electric current regulation layer.

18. A method of manufacturing a semiconductor device as defined in claim 17, further comprising:
a step of implanting impurities of a conductivity type different from impurities contained in the semiconductor layer, these impurities being implanted at an area of the semiconductor layer covering the surface of the electric current regulation layer, this area being between a side close to the non covered surface and a side far from the non-covered surface, wherein an activated impurity concentration is lowered at the implanted area.

19. A method of manufacturing a semiconductor device as defined in claim 17, further comprising:
a step of implanting impurities of a conductivity type different from impurities contained in the semiconductor layer, these impurities being implanted at an area of the semiconductor layer covering the surface of the electric current regulation layer, this area being between a side close to the non covered surface and a side far from the non-covered surface, wherein an activated impurity concentration is reversed at the implanted area.

20. A method of manufacturing a semiconductor device as defined in claim 17, further comprising:
a step of implanting impurities of a conductivity type different from impurities contained in the semiconductor layer, these impurities being implanted into an area of the semiconductor layer covering the electric current regulation layer, this area being separated from the non-covered surface, this implantation being continued until an activated impurity concentration is reversed.

21. A method of manufacturing a semiconductor device as defined in claim 17, wherein the step of growing the semiconductor layer comprises:
a step of growing a lower semiconductor layer covering a surface of the electric current regulation layer, the lower semiconductor layer comprising a III-V semiconductor; and
a step of growing an upper semiconductor layer covering a surface of the lower semiconductor layer, the upper semiconductor layer comprising a III-V semiconductor having a wider band gap than the lower semiconductor layer.

22. A method of manufacturing a semiconductor device as defined in claim 17, further comprising:
a step of forming a trench at the non-covered surface, the trench extending from the surface of the semiconductor layer to the first conductor layer, and
a step of filling a low-resistance conducting material into the trench.

23. A semiconductor device as defined in claim 1, wherein the second electrode is not in contact with the electric current regulation layer.

* * * * *